United States Patent

[11] 3,612,959

[72] Inventor Edward Simon
Manchester, Mass.

[21] Appl. No. 795,605
[22] Filed Jan. 31, 1969
[45] Patented Oct. 12, 1971
[73] Assignee Unitrode Corporation
Watertown, Mass.

[54] PLANAR ZENER DIODES HAVING UNIFORM JUNCTION BREAKDOWN CHARACTERISTICS
4 Claims, 5 Drawing Figs.

[52] U.S. Cl. .......... 317/235 R, 317/234 R, 317/235 T, 317/235 AL, 317/234 Q
[51] Int. Cl. .......... H01l 9/00
[50] Field of Search .......... 317/235, 30, 46, 48, 7

[56] References Cited

UNITED STATES PATENTS

| | | | |
|---|---|---|---|
| 3,514,846 | 6/1970 | Lynch | 29/572 |
| 3,293,010 | 12/1966 | Hackley | 29/195 |
| 3,299,487 | 1/1967 | Cook et al. | 29/25.3 |
| 3,457,469 | 7/1967 | Lawrence | 317/234 |
| 3,378,915 | 4/1968 | Zenner | 29/577 |
| 3,458,781 | 7/1969 | Simon | 317/235 |
| 3,497,776 | 2/1970 | Philips | 317/234 |
| 3,484,309 | 12/1969 | Gilbert | 148/33.5 |
| 3,341,377 | 9/1967 | Wacker | 148/177 |
| 3,450,961 | 6/1969 | Tsai | 317/235 |
| 3,305,913 | 2/1967 | Loro | 29/25.3 |

FOREIGN PATENTS

| | | | |
|---|---|---|---|
| 1,003,131 | 9/1965 | Great Britain | |

*Primary Examiner*—John W. Huckert
*Assistant Examiner*—B. Estrin
*Attorney*—Weingarten, Maxham & Schwigin

ABSTRACT: A high-voltage planar Zener diode in which enhanced switching performance is provided by a unique junction configuration. The junction is configured to provide low-series resistance and uniform conduction across a controlled region of the junction thereby to achieve uniform and sharp voltage breakdown characteristics.

INVENTOR
EDWARD SIMON
BY Joseph Weingarten
Stanley M. Schwarz
ATTORNEYS

PLANAR ZENER DIODES HAVING UNIFORM JUNCTION BREAKDOWN CHARACTERISTICS

FIELD OF THE INVENTION

This invention relates to semiconductor devices and more particularly to planar Zener diodes having improved voltage breakdown characteristics.

BACKGROUND OF THE INVENTION

Zener diodes are often employed as voltage reference or threshold devices by reason of their ability to become conductive at a predetermined voltage level. In high-voltage operation, however, there is a tendency for Zener diodes of conventional planar construction to exhibit poor dynamic resistance especially at low currents in comparison to nonplanar devices and this inherently poor dynamic response has thus far limited the switching performance of such conventional planar devices. In a planar diode structure, the breakdown characteristics are a function of the series resistance and the uniformity of breakdown across the junction. At lower voltages, conduction occurs generally at the periphery of the junction while as the voltage increases, conduction spreads to the central larger region of the junction. Such changing conduction characteristics of conventional planar junctions with varying voltage limits the operating current range of the reference diode in the fully conducting state in breakdown and thus limits the utility of such devices in circuits, especially at low currents.

SUMMARY OF THE INVENTION

In accordance with the present invention, a planar Zener diode is provided in which a unique junction configuration, providing low-series resistance at low currents and uniform conduction across a controlled region of the junction, achieves markedly improved Zener characteristics. The unique junction configuration promotes a relatively large space charge width so that conduction occurs essentially in the central portion thereof. As a result, voltage breakdown occurs in the central junction portion in a controllable and rapid manner, thereby enhancing the switching performance of the devices.

The junction configuration can be of any form which selectively controls the region of conduction to achieve the intended improvement in switching performance. In one embodiment, the junction has a smoothly rounded peripheral configuration of relatively large radius of curvature to promote field alteration in this peripheral region and cause conduction to occur essentially across the central junction portion. In another embodiment, the junction includes a relatively sharp corner portion which extends into a region of lower resistivity. The field is lowered in the vicinity of this corner portion and conduction is caused to occur essentially in the central portion of the junction. A pair of such junctions can be employed in a single device to provide bipolar diode operation, and as a further feature of the invention, the use of two junctions permits temperature compensation together with enhanced switching performance.

DESCRIPTION OF THE DRAWINGS

The invention will be more fully understood from the following detailed description taken in conjunction with the accompanying drawings, wherein.

DETAILED DESCRIPTION OF THE INVENTION

Figure 1:
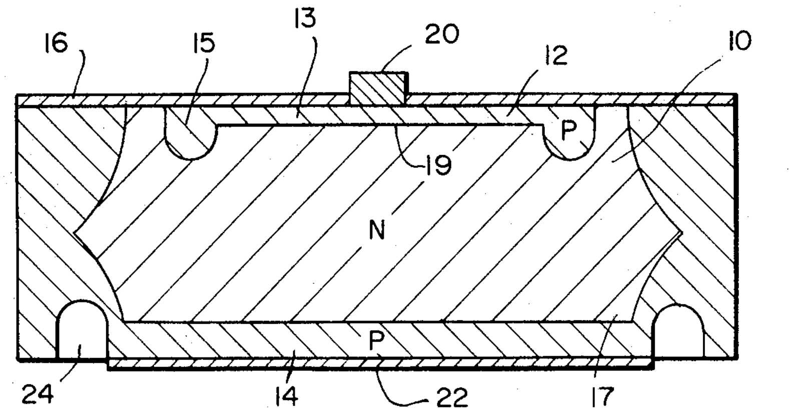
FIG. 1 is a greatly enlarged sectional elevation view of a temperature compensated Zener diode embodying the invention and capable of bipolar operation.

A planar Zener diode embodying the invention is illustrated in greatly exaggerated form in FIG. 1 and includes a mass of N-type material 10 having diffused therein a uniquely configured P-type region 12 forming a first junction with region 10, and a second P-type region 14 diffused around mass 10 to form a second junction therewith. Oxide coating 16 is formed on the upper surface of the device and conductive terminals 20 and 22 are formed in the opening provided in coating 16 to the back surface of the device to contact respective regions 12 and 14 to effect necessary device connection. The device is fabricated by well known planar masking and diffusion techniques such as described in detail in copending application Ser. No. 565,996, filed July 18, 1966 now U.S. Pat. No. 3,458,781 and assigned to the assignee of the present invention. In general, an annular channel 24 is provided in the lower portion of the semiconductor body and a confronting annular portion is provided on the upper surface having no oxide coating. A suitable impurity imparting P-type characteristics is diffused through the unmasked upper surface and through the lower device surface to form the outermost junction having the cusp-shaped periphery. An opening is provided in oxide coating 16 to form the peripheral ring portion 15 of region 12 along with the back surface and then a central opening is provided through which the central portion 13 of region 12 is formed. The contacts 20 and 22 are similarly formed through openings provided in the respective oxide coatings.

The illustrated embodiment is a temperature compensated Zener diode and is operative at either polarity to provide markedly improved high-voltage switching performance. With a positive potential applied to terminal 22 and a negative potential applied to terminal 20, the junction 19 is formed between regions 10 and 12 is reverse biased and provides by its unique junction configuration, rapid and uniform diode breakdown, while the junction formed between regions 10 and 14 is forward biased to provide temperature compensation, in a well-known manner. Region 12 has a relatively shallow central portion 13 and a contiguous peripheral portion 15 merged with portion 13 and of substantially deeper depth. The peripheral portion is of rounded configuration having a radius of curvature larger than the depth of central portion 13, this smoothly rounded peripheral portion being operative to lower the field in the peripheral junction region and inducing diode breakdown to occur essentially in the central portion of junction 19.

In operation, Zener conduction occurs across the diode junction formed between region 12 and region 10, the second PN-junction between regions 10 and 14 being forward biased to provide temperature compensation as is well known. Conduction across the junction 19 occurs essentially in the relatively shallow central portion 13 of region 12 when the Zener breakdown voltage is reached. Breakdown occurs sharply and uniformly at this central portion. Current spreading from the initially conducting peripheral portion of a conventional diode structure is thereby prevented by the present invention since conduction in the peripheral portion 15 of the invention occurs at a higher voltage and conduction occurs essentially across junction 19 in the central region 13.

With a positive potential applied to terminal 20 and a negative potential applied to terminal 22, the junction between regions 10 and 14 is reverse biased to provide diode operation while the junction between regions 10 and 12 is forward biased for temperature compensation. In this latter instance, enhanced switching performance is provided by the configuration of the reverse biased junction since the relatively sharp junction corner 17 extends into material of lower resistivity, with a lower field being present in this region. Conduction is, therefore, caused to occur across the central portion of the junction to provide uniform and rapid voltage breakdown according to the principles of the invention.

Figure 2:
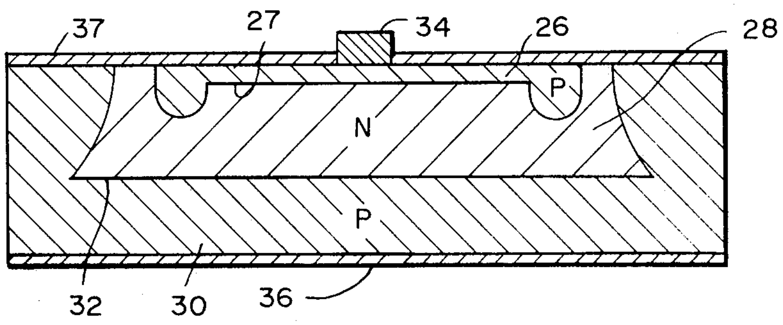
FIGS. 2 and 3 are greatly enlarged sectional elevation views of alternative embodiments of temperature compensated Zener diodes according to the invention.

An alternative embodiment of a bipolar temperature compensated Zener diode is illustrated in FIG. 2 and includes a P-type region 26 having a relatively shallow central portion and surrounding peripheral portion of deeper diffusion, as in FIG. 1, formed within N-type material 28, with a second P-type region 30 formed around region 28. Fabrication of this device configuration is accomplished similarly to that of FIG. 1, however a moat is not employed in the lower surface of the semiconductor body. An annular opening is provided near the periphery of the oxide coating 37 on the upper surface of the semiconductor body, and material imparting P-type characteristics is diffused through this opening and through the lower surface of the device to form the junction 32 between regions 28 and 30. The region 26 is then formed as described hereinabove to provide junction 27 and the contacts 34 and 36 formed to make connection to respective regions 26 and 30. The unique configuration of junction 27, wherein the smoothly rounded peripheral portion provides a reduced field in this peripheral portion, causes conduction to occur essentially across the junction in the central portion thereof to achieve improved switching performance as described hereinabove. With junction 27 providing diode operation, the second junction 32 provides temperature compensation. With junction 32 providing diode operation, switching performance is likewise enhanced by the junction configuration which constrains conduction across the junction to the central region thereof. Thus, with operation at either polarity, enhanced switching performance is achieved in accordance with the present invention.

Figure 3:
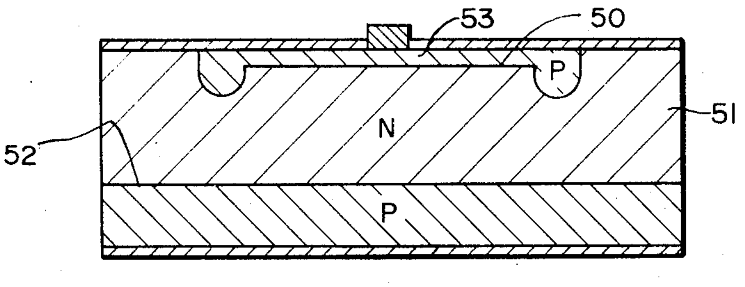

A further embodiment of the invention is illustrated in FIG. 3 and includes a uniquely configured planar junction 50 and a second mesa junction 52 for temperature compensation. In this embodiment, the second junction is not configured to provide enhanced diode operation but only provides temperature compensation, with diode action provided by junction 50. P-type region 53 is formed as described hereinabove in N-type material 51 having a relatively shallow central portion and a surrounding more deeply diffused peripheral portion to provide improved device operation. The second junction, formed by well-known mesa diffusion through the lower surface of material 51 provides a second PN-junction for temperature compensation.

Figure 4:
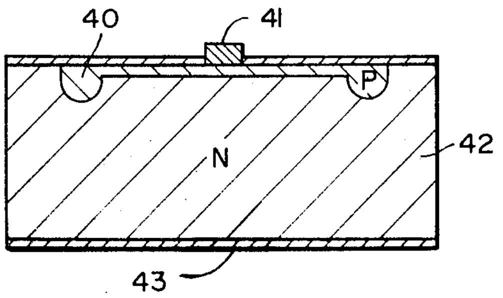
FIGS. 4 and 5 are greatly enlarged sectional elevation views of further embodiments of the invention.
Figure 5:
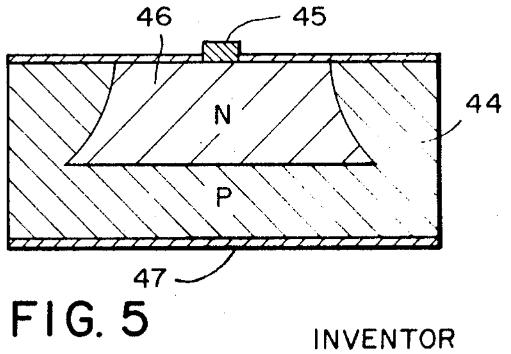

It will be appreciated that any junction which selectively controls conduction thereacross in the manner described above can be employed in the fabrication of a Zener diode according to the invention which provides improved switching performance. In the exemplary embodiments hereinabove, the junction of rounded peripheral configuration provides the intended conduction control, as does the junction having a sharp corner portion extending into a material of lower resistivity. Either of these junction configurations can be employed in a single junction device in which temperature compensation is not required. FIGS. 4 and 5 depict such single junction devices according to the invention. In FIG. 4, a uniquely shaped region 40 of P-type material is formed in N-type mass 42 to define the diode junction. Region 40, as described hereinabove, has a relatively shallow central portion and a surrounding peripheral portion of smoothly rounded configuration. Terminals 41 and 43 are formed in contact with respective regions 40 and 42 to provide device connection. In operation, the field in the peripheral junction region is according to the invention lower than that in the central junction region, causing voltage breakdown to occur rapidly and controllably in the central region of the junction. In the embodiment of FIG. 5, a region 44 of P-type material is formed around N-type region 46 to provide a junction configured to provide enhanced diode operation. Terminals 45 and 47 are provided for device connection. The sharp corner portion of the junction extends into material of lower resistivity and the field in the vicinity departing this corner portion is lower than the field in the central portion of the junction. Conduction is thereby caused to occur essentially in the central junction portion to provide the improved switching performance.

The invention is not to be limited by what has been particularly shown and described as various modifications and alternative implementations will occur to those versed in the art without departing from the spirit and true scope of the invention.

I claim:

1. A planar Zener diode comprising:
   a mass of semiconductor material of one conductivity type;
   a first region of semiconductor material of opposite conductivity type forming a first planar junction with said mass;
   a second region of semiconductor material of opposite conductivity type forming a second planar junction with said mass;
   said first and second regions being separated by said mass to an extent sufficient to provide independent diode operation across the first and second junctions;
   said first region having a central portion substantially parallel to a surface of said diode and a contiguous peripheral portion extending to said surface and having a rounded configuration of radius of curvature larger than the depth of said central portion;
   said second junction having a central portion substantially parallel to said surface and a contiguous peripheral portion of pointed configuration; and
   first and second terminals connected to said first and second regions, respectively.

2. A planar Zener diode according to claim 1 wherein said first and second regions are each planar and each have a central portion operative to provide rapid and uniform breakdown characteristics and a contiguous surrounding peripheral portion operative to provide a lower field causing breakdown to occur essentially in said central portion.

3. A planar Zener diode comprising:
   a mass of semiconductor material of one conductivity type having at least one substantially plane surface;
   a first region of semiconductor material of opposite conductivity type forming a first planar Zener junction with said mass, said first region having a central portion substantially parallel to said plane surface and a contiguous surrounding peripheral portion of greater depth from said plane surface than said central portion and extending to said plane surface and having a rounded configuration of radius of curvature larger than the depth of said central portion;
   said central portion of said first region providing low-series resistance and said surrounding peripheral portion providing a lower field causing reverse biased breakdown to occur essentially in said central portion;
   a second region of semiconductor material of opposite conductivity type and of lower resistivity than said mass of semiconductor material forming a second junction with said mass, said second region having a central portion substantially parallel to said plane surface and removed therefrom to an extent to provide a second Zener junction independent from said first Zener junction and of opposite breakdown polarity, and a surrounding peripheral portion which joins said central portion to define a relatively sharp corner portion which extends into said second region of lower resistivity, said corner portion exhibiting a lower field to cause reverse biased breakdown to occur essentially in said central portion of said second junction; and
   first and second terminals each connected to respective first and second regions;
   said first junction being operative with a potential of one polarity applied to said terminals to provide Zener operation while said second junction provides temperature compensating forward conduction, and said second junction being operative with a potential of opposite polarity applied to said terminals to provide Zener operation while said first junction provides temperature compensating forward conduction.

4. A planar Zener diode comprising:
   a mass of semiconductor material of one conductivity type;
   a first region of semiconductor material of opposite conductivity type forming a first planar junction with said mass;

a second region of semiconductor material of opposite conductivity type forming a second planar junction with said mass;

said first and second regions being separated by said mass to an extent sufficient to provide independent diode operation across the first and second junctions;

said first region having a central portion adapted to provide low-series resistance and a contiguous peripheral portion extending to a surface of said diode and having a rounded configuration of radius of curvature greater than the depth of said central portion;

said second region having a central portion substantially parallel to said surface and a contiguous peripheral portion of resistivity relatively lower than the resistivity of said mass;

said second junction having a peripheral portion of pointed configuration in order to prevent a peripheral increase in the field in said mass adjacent said second junction whereby reverse voltage breakdown of said second junction is induced to occur through said central portion of said second region; and first and second terminals connected to said first and second regions, respectively.